US012701665B2

(12) United States Patent
Jeong et al.

(10) Patent No.: US 12,701,665 B2
(45) Date of Patent: Aug. 4, 2026

(54) DISPLAY DEVICE

(71) Applicant: Samsung Display Co., LTD., Yongin-si (KR)

(72) Inventors: Jaewon Jeong, Yongin-si (KR);
Jonghyuck Kim, Yongin-si (KR);
Juyeop Seong, Yongin-si (KR);
Hee-Kwon Lee, Yongin-si (KR);
Jae-Soo Jang, Yongin-si (KR)

(73) Assignee: SAMSUNG DISPLAY CO., LTD.,
Gyeonggi-Do (KR)

( * ) Notice: Subject to any disclaimer, the term of this patent is extended or adjusted under 35 U.S.C. 154(b) by 219 days.

(21) Appl. No.: 18/630,433

(22) Filed: Apr. 9, 2024

(65) Prior Publication Data

US 2025/0040063 A1      Jan. 30, 2025

(30) Foreign Application Priority Data

Jul. 27, 2023     (KR) ........................ 10-2023-0098351

(51) Int. Cl.
*H05K 5/02*          (2006.01)
(52) U.S. Cl.
CPC ..................................... *H05K 5/02* (2013.01)
(58) Field of Classification Search
CPC ...... G06F 1/633; G06F 1/1637; G06F 1/1652;
H05K 7/00; H05K 7/10; H05K 7/111
See application file for complete search history.

(56) References Cited

U.S. PATENT DOCUMENTS

| | | | |
|---|---|---|---|
| 10,164,208 B2 | 12/2018 | Lee et al. | |
| 10,539,978 B2 | 1/2020 | Lee et al. | |
| 11,785,796 B2 | 10/2023 | Kim et al. | |
| 2021/0174711 A1* | 6/2021 | Cho | ........................ G09F 9/301 |
| 2022/0141967 A1* | 5/2022 | Gu | ........................... B32B 7/12 |
| | | | 361/807 |

FOREIGN PATENT DOCUMENTS

| | | |
|---|---|---|
| KR | 1020170141440 A | 12/2017 |
| KR | 1020180079091 A | 7/2018 |
| KR | 1020200030939 A | 3/2020 |
| KR | 1020210150942 A | 12/2021 |
| KR | 1020210157941 A | 12/2021 |

* cited by examiner

*Primary Examiner* — Zachary M Davis
(74) *Attorney, Agent, or Firm* — CANTOR COLBURN LLP

(57)          ABSTRACT

A display device includes: a display layer including a plurality of non-folding areas and a folding area disposed between the plurality of non-folding areas; a barrier layer disposed under the display layer; and a support plate disposed under the barrier layer, where the barrier layer includes: a first part having a first modulus, and a second part adjacent to the first part and having a second modulus different from the first modulus.

18 Claims, 16 Drawing Sheets

AP421            AP420            AP422

DISPLAY DEVICE

This application claims priority to Korean Patent Application No. 10-2023-0098351, filed on Jul. 27, 2023, and all the benefits accruing therefrom under 35 U.S.C. § 119, the content of which in its entirety is herein incorporated by reference.

BACKGROUND

Embodiments of the present disclosure described herein relate to a display device, and more particularly, to a foldable display device.

Electronic devices such as smart phones, digital cameras, laptop computers, navigation devices, and smart televisions that provide images to users include display devices for displaying the images. The display devices generate the images and provide the images to the users through display screens.

With the technological development of the display devices, various types of display devices have been developed. For example, flexible display devices or the like that may be deformed into a curved shape or folded or rolled have been developed. The flexible display devices of which a shape may be variously deformed may be easily carried and improve user convenience.

SUMMARY

Embodiments of the present disclosure provide a display device having improved reliability.

According to an embodiment, a display device includes: a display layer including a plurality of non-folding areas and a folding area disposed between the plurality of non-folding areas, a barrier layer disposed under the display layer, and a support plate disposed under the barrier layer, where the barrier layer includes a first part having a first modulus, and a second part adjacent to the first part and having a second modulus different from the first modulus.

The second modulus may be greater than the first modulus.

When viewed on a plane, a plurality of openings may be defined in an area of the support plate, which overlaps the folding area, and when viewed on a plane, the second part may overlap at least some of the plurality of openings.

The second part may extend in a first direction, and the first part may extend in the first direction and may be adjacent to the second part in a second direction interesting the first direction.

A plurality of second parts may be provided, and the plurality of second parts may be spaced apart from each other in the second direction with the first part interposed therebetween.

The barrier layer may further include a third part disposed in a different layer from those of the first part and the second part, and when viewed on a plane, the third part may cover the support plate.

The third part may have the second modulus and may be formed integrally with the second part, a plurality of second parts may be provided, each of the plurality of second parts may extend in a first direction, and the plurality of second parts may be spaced apart from each other in a second direction intersecting the first direction with the first part interposed therebetween.

The third part may have the first modulus and may be formed integrally with the first part.

The barrier layer may further include an adhesive layer between the third part and the first part or between the first part and the second part.

A plurality of second parts may be provided, each of the plurality of second parts may extend in a first direction, and the plurality of second parts may be spaced apart from each other in a second direction intersecting the first direction.

When viewed on a plane, the second part may be defined along an edge of the support plate, and when viewed on a plane, the first part may be surrounded by the second part.

A plurality of second parts may be provided, when viewed on a plane, the plurality of second parts may overlap the plurality of non-folding areas, and when viewed on a plane, the first part may not overlap an edge of the support plate.

According to an embodiment, a display device includes: a display layer including a plurality of non-folding areas and a folding area disposed between the plurality of non-folding areas, a barrier layer disposed under the display layer, and a support plate disposed under the barrier layer, where the barrier layer includes a first part extending in a first direction when viewed on a plane and having a first modulus, and a second part spaced apart from the first part in a second direction intersecting the first direction when viewed on a plane and having a second modulus higher than the first modulus.

When viewed on a plane, the first part may overlap portions of the folding area and the plurality of non-folding areas.

When viewed on a plane, a plurality of openings may be defined in an area of the support plate, which overlaps the folding area, and when viewed on a plane, the first part may overlap at least some of the plurality of openings.

A plurality of second parts may be provided, and the plurality of second parts may be spaced apart from each other in the second direction with the first part interposed therebetween.

When viewed on a plane, the barrier layer may cover the support plate.

The first part and the second part may be arranged in the same layer.

A display area and a non-display area adjacent to the display area may be defined on the display layer, and the display layer may be out-folded so that the display area is exposed to the outside.

The display device may further include a first adhesive layer disposed between the display layer and the barrier layer, and a second adhesive layer disposed between the barrier layer and the support plate.

BRIEF DESCRIPTION OF THE FIGURES

The above and other aspects and features of the present disclosure will become apparent by describing in detail embodiments thereof with reference to the accompanying drawings.

DETAILED DESCRIPTION

Figure 1:
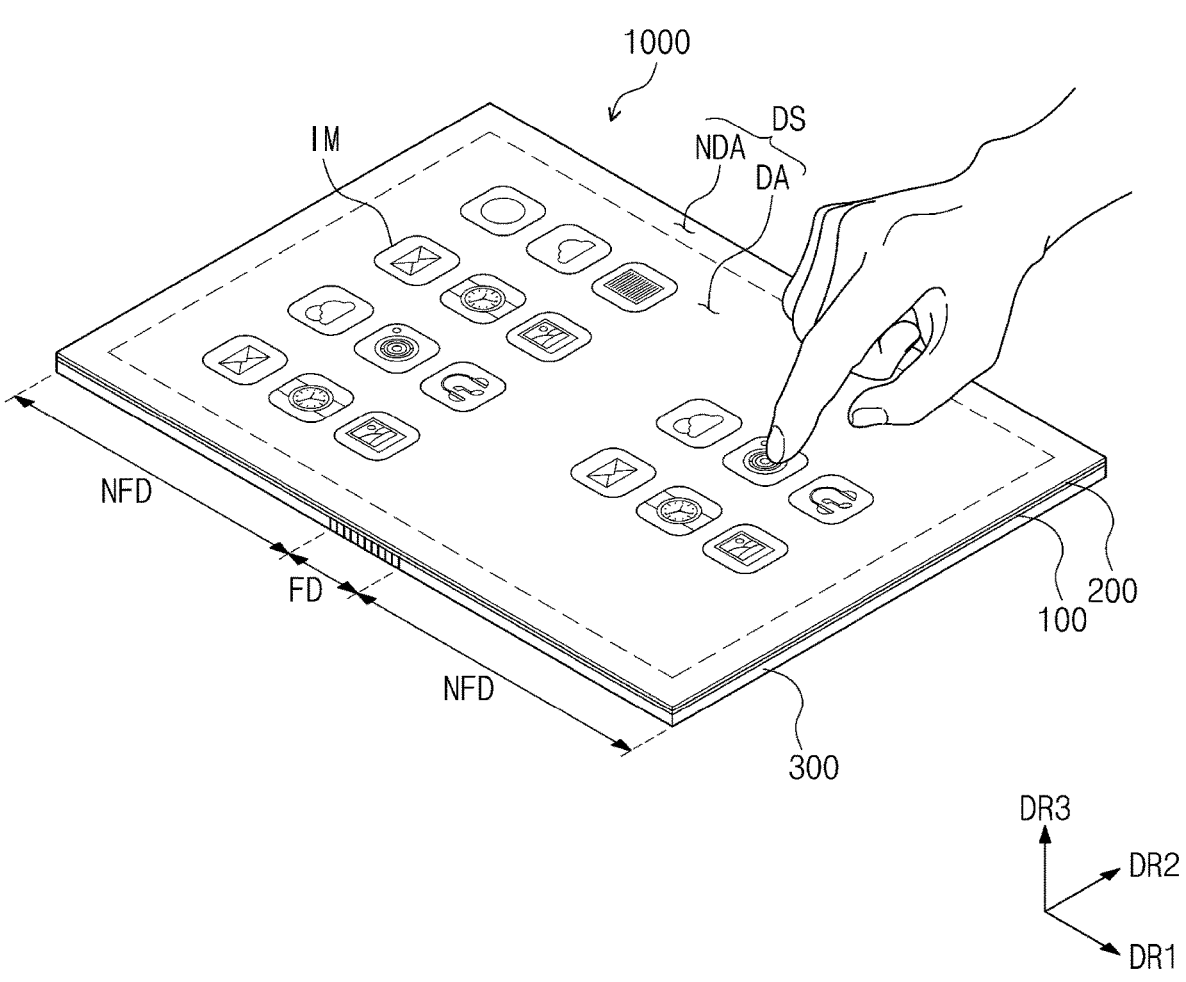
FIG. 1 is a perspective view of a display device according to an embodiment of the present disclosure.

In the present specification, the expression that a first component (or area, layer, part, portion, etc.) is "on", "connected with", or "coupled to" a second component means that the first component is directly on, connected with, or coupled to the second component or means that a third component is interposed therebetween.

The same reference numerals refer to the same components. Further, in the drawings, the thickness, the ratio, and the dimension of components are exaggerated for effective description of technical contents. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The expression "and/or" includes one or more combinations which associated components are capable of defining.

Although the terms "first", "second", etc. may be used to describe various components, the components should not be limited by the terms. The terms are only used to distinguish one component from another component. For example, without departing from the right scope of the present disclosure, a first component may be referred to as a second component, and similarly, the second component may be also referred to as the first component. Singular expressions include plural expressions unless clearly otherwise indicated in the context.

Also, the terms "under", "below", "on", "above", etc. are used to describe the correlation of components illustrated in drawings. The terms that are relative in concept are described based on a direction illustrated in drawings.

It will be understood that the terms "include", "comprise", "have", etc. specify the presence of features, numbers, steps, operations, elements, or components, described in the specification, or a combination thereof, and do not exclude in advance the presence or additional possibility of one or more other features, numbers, steps, operations, elements, or components or a combination thereof.

Unless otherwise defined, all terms (including technical terms and scientific terms) used in the present specification have the same meaning as commonly understood by those skilled in the art to which the present disclosure belongs. Furthermore, terms such as terms defined in the dictionaries commonly used should be interpreted as having a meaning consistent with the meaning in the context of the related technology, and should not be interpreted in overly ideal or overly formal meanings unless explicitly defined herein.

Hereinafter, an embodiment of the present disclosure will be described with reference to accompanying drawings.

Figure 2:
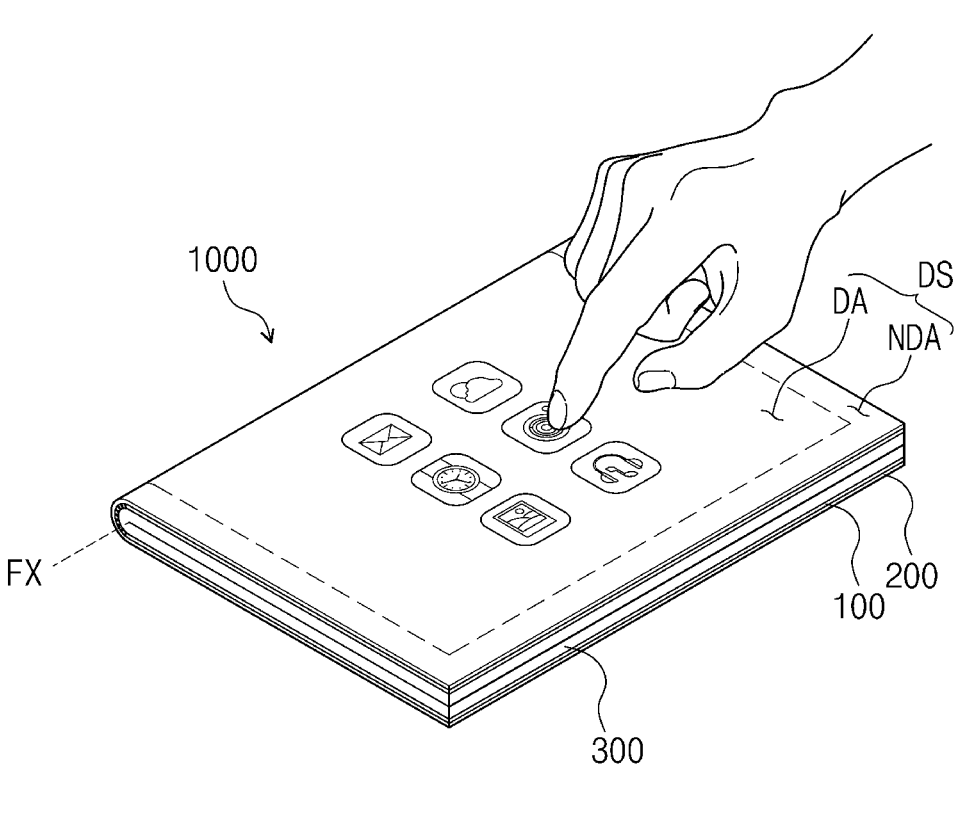
FIG. 2 is a view illustrating a state in which the display device according to an embodiment of the present disclosure is out-folded.
Figure 2:
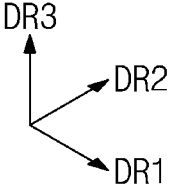

FIG. 1 is a perspective view of a display device according to an embodiment of the present disclosure, and FIG. 2 is a view illustrating a state in which the display device according to an embodiment of the present disclosure is out-folded.

Referring to FIGS. 1 and 2, a display device 1000 according to an embodiment of the present disclosure may have a rectangular shape having long sides in a first direction DR1 and short sides in a second direction DR2 intersecting the first direction DR1. However, the present disclosure is not limited thereto, and the display device 1000 may have various shapes. The display device 1000 may be the flexible display device 1000 and may be the foldable display device 1000 that is folded or unfolded with respect to a folding axis FX extending in the second direction DR2.

The display device 1000 may be divided into a plurality of areas according to folding. For example, the display device 1000 may be divided into a folding area FD along which the display device 1000 is folded and two non-folding areas NFD in a flat state. The non-folding areas NFD may be arranged in the first direction DR1, and the folding area FD may be disposed between the two non-folding areas NFD. In an embodiment, one folding area FD is defined in the display device 1000, but the present disclosure is not limited thereto, and a plurality of folding areas FD may be defined in the display device 1000 in another embodiment.

The display device 1000 may include a display layer 100, a sensor layer 200 disposed on the display layer 100, and a support plate 300 disposed under the display layer 100. An upper surface of the display layer 100 may be defined as a display surface DS and may be a plane parallel to the first direction DR1 and the second direction DR2. Images IM generated by the display layer 100 may be provided to a user through the display surface DS.

The folding area FD and the plurality of non-folding areas NFD may be defined in the display layer 100.

A thickness direction of the display layer 100 may be parallel to a third direction DR3 intersecting the first direction DR1 and the second direction DR2. Thus, front surfaces (or upper surfaces) and rear surfaces (or lower surfaces) of members constituting the display layer 100 may be defined based on the third direction DR3. Further, in the present specification, the meaning of "on a plane" may be defined as a state of when viewed in the third direction DR3.

The display surface DS may include a display area DA and a non-display area NDA around the display area DA. The display area DA displays an image, and the non-display area NDA does not display the image. The non-display area NDA may surround the display area DA and provide an edge of the display device 1000, which is printed in a predetermined color.

The display layer 100 may have flexibility. For example, the display layer 100 may operate in a folded or unfolded state. The display layer 100 may generate the image IM and provide the generated image IM to the user. The display layer 100 may be a light emitting display layer, but the present disclosure is not particularly limited thereto. For example, the display layer 100 may be an organic light emitting display layer, an inorganic light emitting display layer, a nano light emitting diode ("LED") display layer, or a micro LED display layer. A light emitting layer of the organic light emitting display panel may include an organic light emitting material. A light emitting layer of the inorganic light emitting display layer may include a quantum dot, a quantum rod, or the like. A light emitting layer of the nano LED display layer may include a nano LED. A light emitting layer of the micro LED display layer may include a micro LED.

The sensor layer 200 may detect an external input (a hand of the user, a touch pen or the like), convert the external input into a predetermined input signal, and provide the input signal to the display layer 100. The sensor layer 200 may include a plurality of touch sensor units (not illustrated) for detecting the external input. The touch sensor units may detect the external input in a capacitive manner. The display layer 100 may receive the input signal from the sensor layer 200 and generate an image corresponding to the input signal.

The support plate 300 may support the display layer 100 and may be folded by rotating about the folding axis FX. As the support plate 300 is folded, the flexible display layer 100 may be folded by the support plate 300. When the display device 1000 is folded, the support plate 300 may out-fold the display device 1000 so that the display surface DS of the display layer 100 is exposed to the outside.

Figure 3:
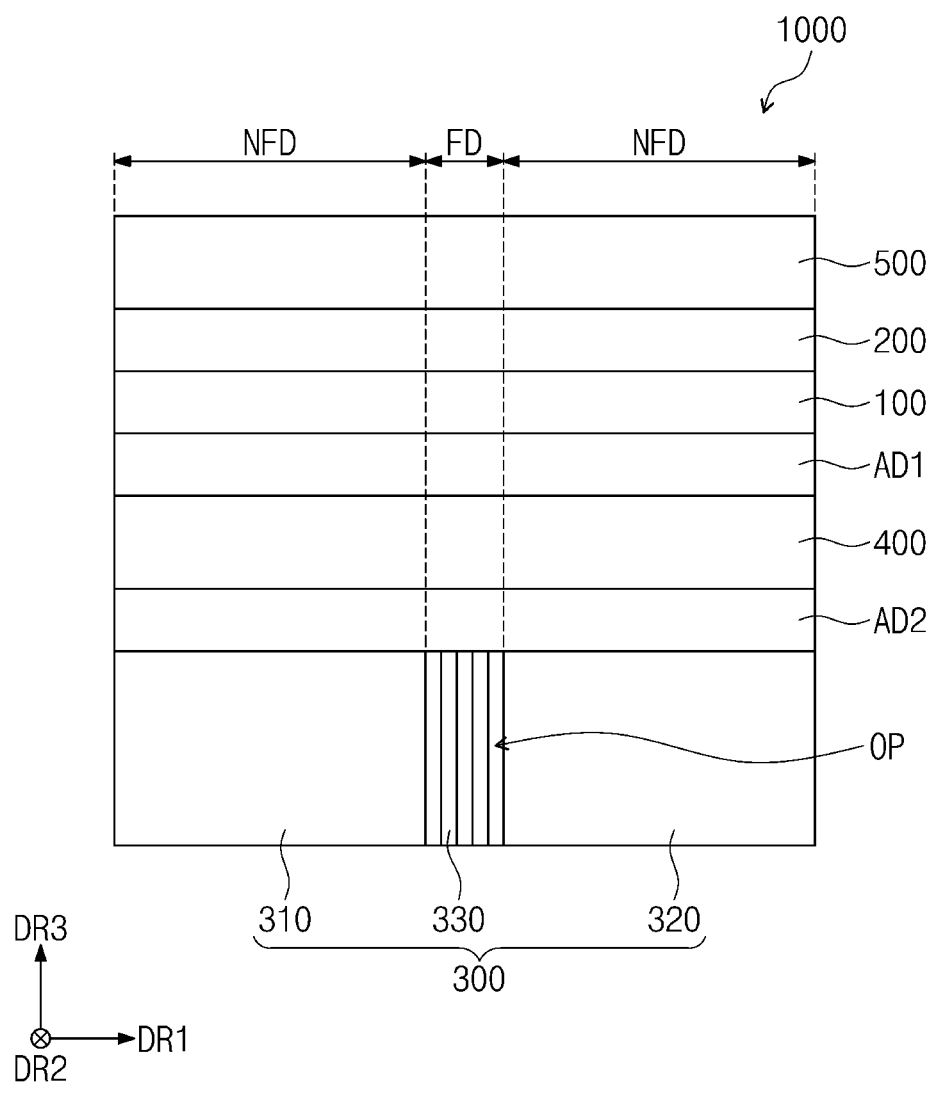
FIG. 3 is a cross-sectional view of the display device according to an embodiment of the present disclosure.

FIG. 3 is a cross-sectional view of the display device according to an embodiment of the present disclosure.

Referring to FIG. 3, the display device 1000 may include the display layer 100, the sensor layer 200, the support plate 300, a plurality of adhesive layers AD1 and AD2, a barrier layer 400, and an upper member 500.

The upper member 500 may be disposed on the sensor layer 200. The upper member 500 may provide an optically transparent area. The upper member 500 may provide the display surface DS (see FIG. 1) of the display device 1000. The image IM (see FIG. 1) displayed on the display layer 100 may be visually recognized by the user through the upper member 500.

The upper member 500 may include an optical layer and a window. However, this is exemplarily, and components included in the upper member 500 according to an embodiment of the present disclosure are not limited thereto and may be variously provided.

The optical layer may be disposed on the sensor layer 200. The optical layer may reduce a reflectance of an external light beam. The optical layer may include a stretched synthetic resin film. For example, the optical layer may be provided by dyeing an iodine compound to a polyvinyl alcohol ("PVA") film. Alternatively, the optical layer may include a color filter. The optical layer may include various layers as long as the layers may reduce the reflectance of the external light beam and is not limited to an embodiment.

The window may be disposed on the optical layer. The window may provide an optically transparent area. The window may provide the display surface DS (see FIG. 1) of the display device 1000. The image IM (see FIG. 1) displayed on the display layer 100 may be visually recognized by the user through the window.

The window may include a thin film glass or synthetic resin film. When the window includes the thin film glass, a thickness of the window may be 100 μm (micrometer) or less, for example, 60 μm, but the thickness of the window is not limited thereto. When the window includes the synthetic resin film, the window may include a polyimide ("PI") film or a polyethylene terephthalate ("PET") film in an embodiment.

The window may be made of a flexible material. Accordingly, the window can be folded or unfolded with respect to the folding axis FX (see FIG. 2). That is, when a shape of the display layer 100 is changed, a shape of the window may be changed to correspond to the shape of the display layer 100.

The optical layer and the window may be joined by a predetermined adhesive layer. The adhesive layer may include an optical clear adhesive ("OCA"), an optical clear resin ("OCR"), or a pressure sensitive adhesive ("PSA") in an embodiment. Adhesive layers described below may include the same material as the material of the adhesive layer and include general adhesives or pressure-sensitive adhesives. For example, the adhesive layer may have a thickness of about 50 μm.

The first adhesive layer AD1 and the second adhesive layer AD2 may include the OCA, the OCR, and the PSA.

The barrier layer 400 may be disposed under the display layer 100. The barrier layer 400 may be adhered to the display layer 100 through the first adhesive layer AD1. The barrier layer 400 may include polyethylene terephthalate (PET) and/or thermoplastic polyurethane elastomer ("TPU"). However, this is exemplarily, and constituent materials of the barrier layer 400 according to an embodiment of the present disclosure are not limited thereto and may be variously provided.

The barrier layer 400 may protect the display layer 100. The barrier layer 400 can enhance an impact resistance of the display layer 100. The barrier layer 400 may improve a buckling phenomenon that occurs in open portions at opposite ends of a plurality of openings OP in the second direction DR2. This will be described below.

The support plate 300 may be disposed under the barrier layer 400. The support plate 300 may be adhered to the barrier layer 400 through the second adhesive layer AD2. The support plate 300 may support the display layer 100. The support plate 300 may include a first support part 310, a second support part 320, and a folding part 330. The first support part 310 and the second support part 320 may be spaced apart from each other in the first direction DR1 with the folding part 330 interposed therebetween. A thickness of the support plate 300 may be greater than the thickness of the display layer 100. For example, the thickness of the support plate 300 may be about 150 μm.

When viewed on a plane, the first support part 310 and the second support part 320 may overlap the non-folding areas NFD, respectively.

The folding part 330 may overlap the folding area FD. The plurality of openings OP passing in the third direction DR3 may be defined in the folding part 330. The plurality of openings OP may be spaced apart from each other in the first direction DR1. Accordingly, the folding part 330 may have a lattice shape when viewed on a plane. As the size of each of the plurality of openings OP is changed, the shape of the support plate 300 in the folding area FD may be easily changed. Meanwhile, although not illustrated, the plurality of openings OP may be filled with a material having high ductility.

The shape of the folding part 330 may be easily changed by the plurality of openings OP when the folding part 330 is folded. The folding part 330 may be formed of the same material as the material of the first support part 310 and the second support part 320. However, this is exemplarily, and the folding part 330 according to an embodiment of the present disclosure may include a different material from the material of the first support part 310 and the second support part 320. For example, the folding part 330 may include a single metal or an alloy. Accordingly, the folding part 330 may stably protect the folding area FD of the display layer 100 even in a folded state.

Figure 4:
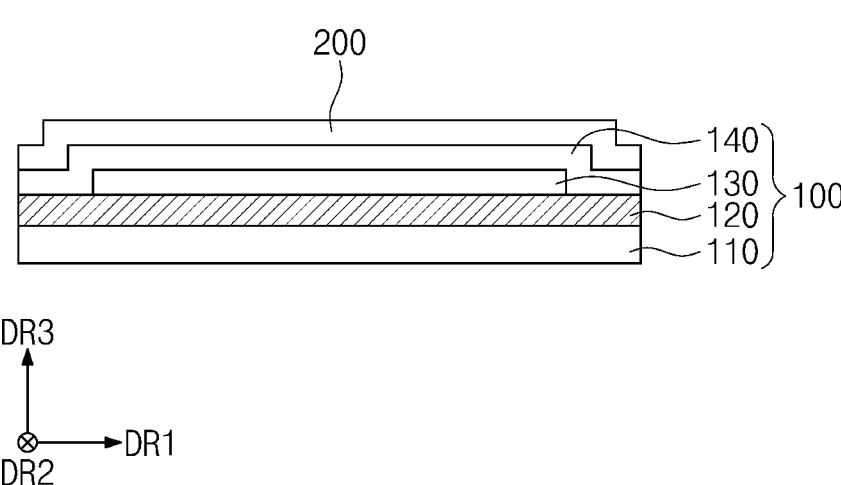
FIG. 4 is a cross-sectional view illustrating a display layer and a sensor layer according to an embodiment of the present disclosure.

FIG. 4 is a cross-sectional view illustrating a display layer and a sensor layer according to an embodiment of the present disclosure.

Referring to FIG. 4, the display layer 100 may include a base layer 110, a circuit layer 120, a light emitting element layer 130, and an encapsulation layer 140.

The base layer 110 may be a member that provides a surface on which the circuit layer 120 is disposed. The base layer 110 may be a glass substrate, a metal substrate, or a polymer substrate. However, an embodiment is not limited thereto, and the base layer 110 may be an inorganic layer, an organic layer, or a composite material layer in another embodiment.

The base layer 110 may have a multilayer structure. For example, the base layer 110 may include a first synthetic resin layer, a silicon oxide ($SiO_x$) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. Further, each of the first and second synthetic resin layers may include at least one of an acrylate-based resin, a methacrylate-based resin, a poly-isoprene-based resin, a vinyl-based resin, an epoxy-based resin, a urethane-based resin, a cellulose-based resin, a siloxane-based resin, a polyamide-based resin, and a perylene-based resin. Meanwhile, in the present specification, a "~~" based resin means a resin containing a functional group of "~~".

The circuit layer 120 may be disposed on the base layer 110. The circuit layer 120 may include an insulating layer, a semiconductor pattern, a conductive pattern, a signal line, and the like. The insulating layer, the semiconductor layer, and the conductive layer are formed on the base layer 110 in a method such as coating and deposition, and thereafter, the insulating layer, the semiconductor layer, and the conductive layer may be selectively patterned through a plurality of photolithography processes. Thereafter, the semiconductor pattern, the conductive pattern, and the signal line included in the circuit layer 120 may be formed.

The light emitting element layer 130 may be disposed on the circuit layer 120. The light emitting element layer 130 may include a light emitting element. For example, the light emitting element layer 130 may include an organic light emitting material, a quantum dot, a quantum rod, a micro LED, or a nano LED.

The encapsulation layer 140 may be disposed on the light emitting element layer 130. The encapsulation layer 140 may protect the light emitting element layer 130 from foreign substances such as moisture, oxygen, and dust particles.

The sensor layer 200 may be formed on the display layer 100 through a continuous process. In this case, it may be expressed that the sensor layer 200 is directly disposed on the display layer 100. The aspect that the sensor layer 200 is directly disposed on the display layer 100 may mean that a third component is not disposed between the sensor layer 200 and the display layer 100. That is, a separate adhesive member may not be disposed between the sensor layer 200 and the display layer 100. Alternatively, the sensor layer 200 may be coupled to the display layer 100 through an adhesive member. The adhesive member may include a general adhesive or a pressure-sensitive adhesive.

Figure 5:
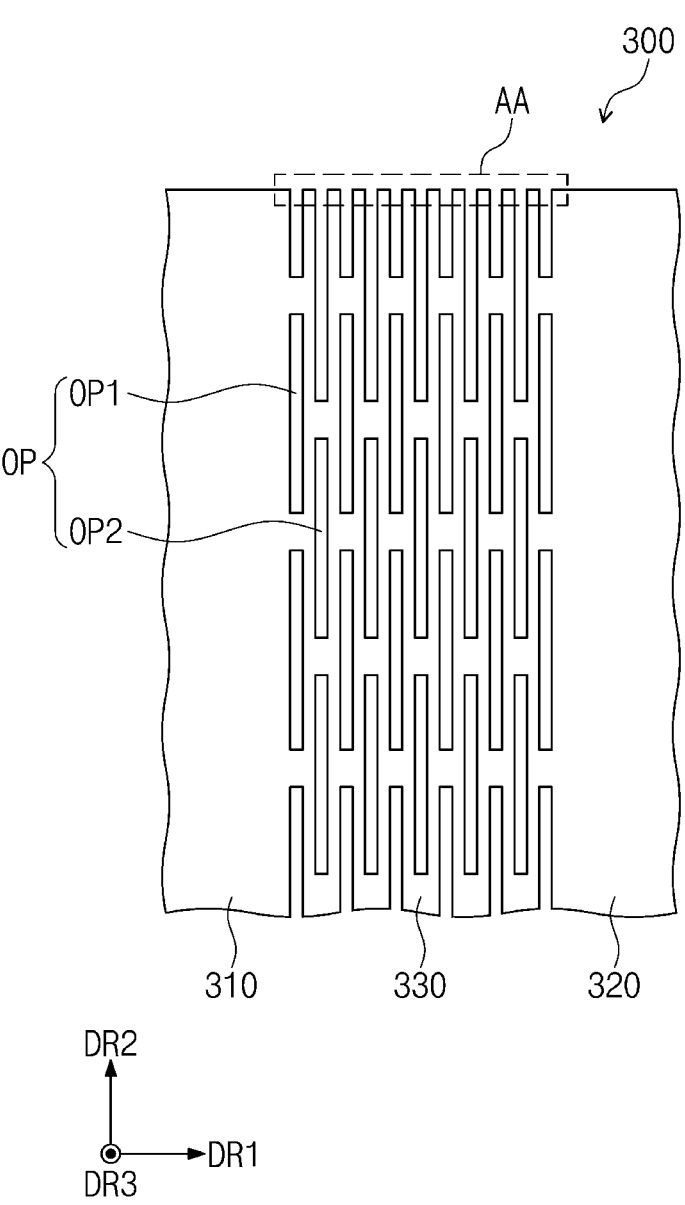
FIG. 5 is a plan view illustrating a portion of a support plate according to an embodiment of the present disclosure.

FIG. 5 is a plan view illustrating a portion of a support plate according to an embodiment of the present disclosure. As used herein, the "plan view" is a view in the thickness direction (i.e., third direction DR3) of the display layer 100, and the expression, "when viewed on a plane", is used in the same meaning as "in a plan view".

Referring to FIGS. 3 and 5, the plurality of openings OP may be defined by removing portions of the folding part 330. Each of the plurality of openings OP may extend in the second direction DR2. The plurality of openings OP may be arranged in the first direction DR1 and the second direction DR2.

The plurality of openings OP may include a plurality of first openings OP1 arranged in the first direction DR1 and the second direction DR2 and a plurality of second openings OP2 arranged in the first direction DR1 and the second direction DR2. The plurality of second openings OP2 may be arranged between the plurality of first openings OP1 in the first direction DR1. The plurality of second openings OP2 may be arranged alternately with the plurality of first openings OP1.

Unlike the present disclosure, when the display device 1000 does not include the barrier layer 400, a buckling phenomenon may occur in an open first area AA at opposite ends of the plurality of openings OP in the second direction DR2 due to a repulsive force generated when the display layer 100 is folded. However, according to the present disclosure, the barrier layer 400 may be disposed between the display layer 100 and the support plate 300. The barrier layer 400 may be made of a material having a relatively high modulus in the first area AA or an area adjacent thereto. The buckling phenomenon that may occur in the first area AA may be effectively prevented or removed. Thus, the display device 1000 having improved reliability may be provided.

Figure 6:
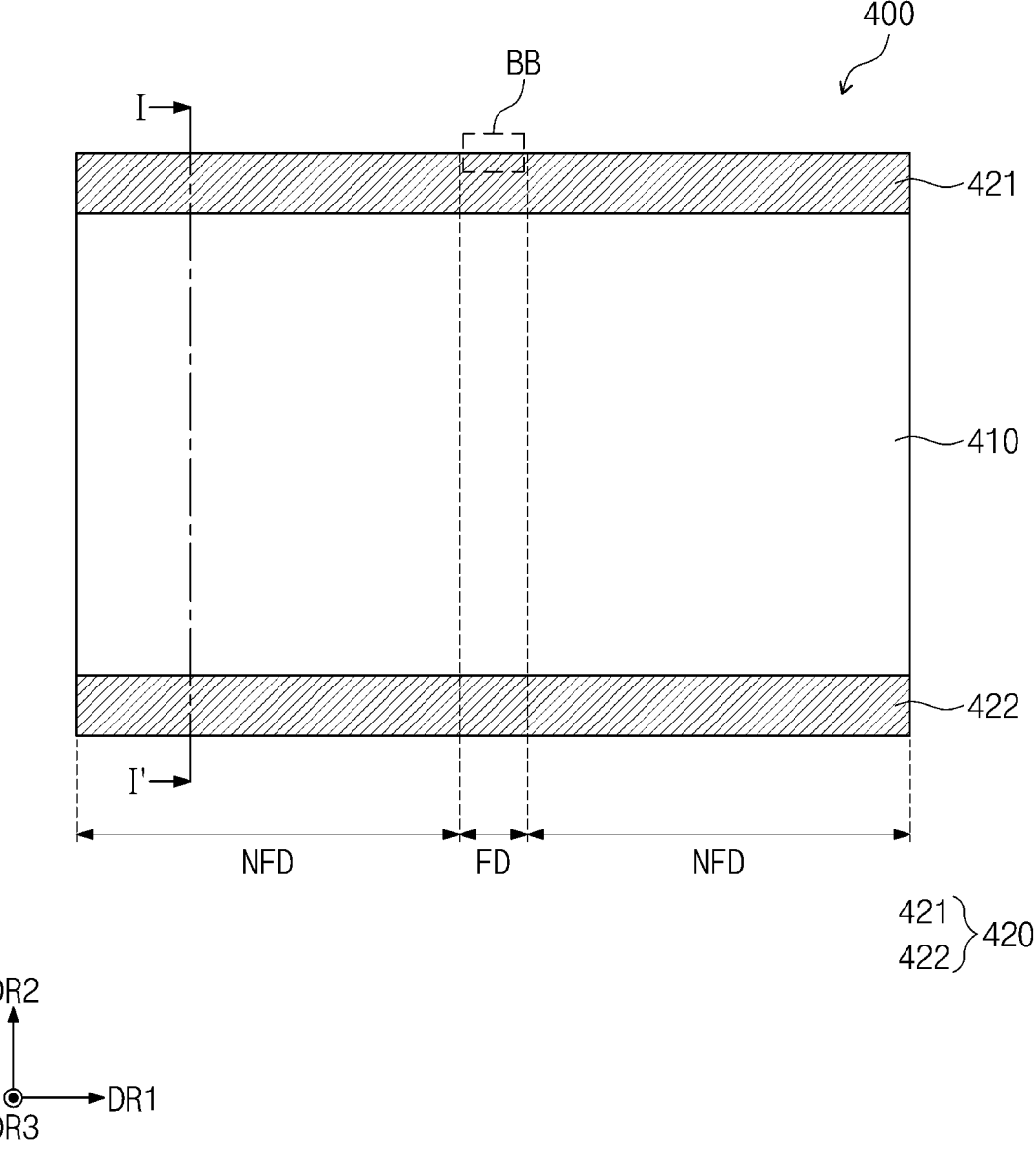
FIG. 6 is a plan view illustrating a barrier layer according to an embodiment of the present disclosure.
Figure 7:
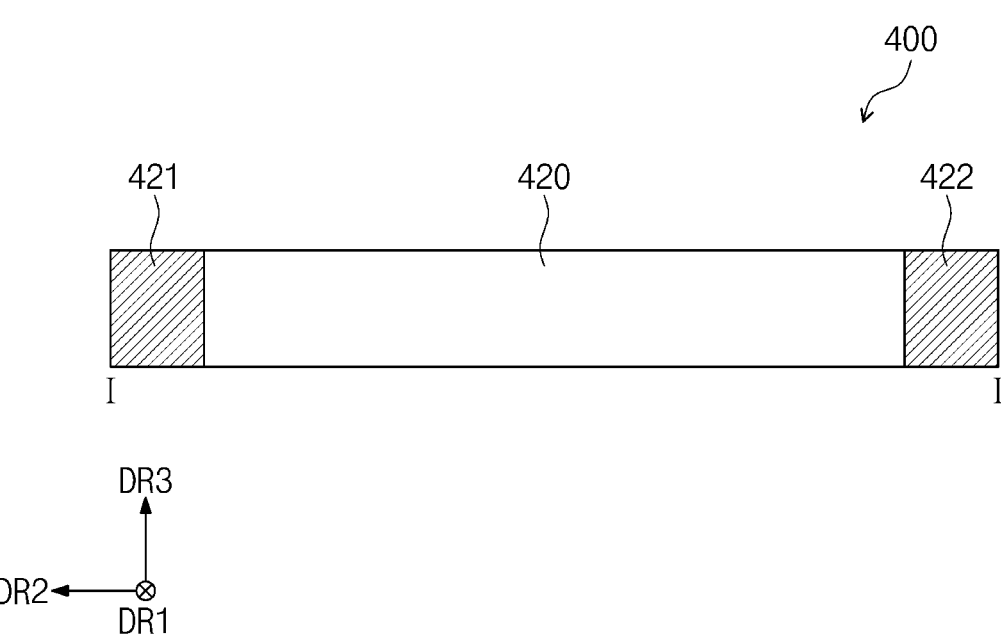
FIG. 7 is a cross-sectional view of the barrier layer along line I-I' of FIG. 6 according to an embodiment of the present disclosure.

FIG. 6 is a plan view illustrating a barrier layer according to an embodiment of the present disclosure, and FIG. 7 is a cross-sectional view of the barrier layer along line I-I' of FIG. 6 according to an embodiment of the present disclosure.

Referring to FIGS. 3, 5, 6, and 7, when viewed on a plane, the barrier layer 400 may cover the support plate 300. The barrier layer 400 may include a first part 410 and a second part 420. The first part 410 and the second part 420 may be arranged in the same layer.

The first part 410 may have a first modulus. The first modulus may have a rigidity of 10 megapascals (MPa) to 1 gigapascal (GPa).

The first part 410 may extend in the first direction DR1. The first part 410 may be disposed between a $(2\text{-}1)^{th}$ part 421 and a $(2\text{-}2)^{th}$ part 422. The first part 410 may be adjacent to each of the $(2\text{-}1)^{th}$ part 421 and the $(2\text{-}2)^{th}$ part 422 in the second direction DR2. When viewed on a plane, the first part 410 may overlap at least portions of the plurality of openings OP (see FIG. 5). Further, the first part 410 may overlap portions of the plurality of non-folding areas NFD and the folding area FD.

The second part 420 may have a second modulus that is different from the first modulus. The second modulus may be higher than the first modulus. The second modulus may have a rigidity of 100 MPa to 10 GPa.

The second part 420 may be adjacent to the first part 410. The second part 420 may include the $(2\text{-}1)^{th}$ part 421 and the $(2\text{-}2)^{th}$ part 422. Each of the $(2\text{-}1)^{th}$ part 421 and the $(2\text{-}2)^{th}$ part 422 may extend in the first direction DR1. The $(2\text{-}1)^{th}$ part 421 and the $(2\text{-}2)^{th}$ part 422 may be spaced apart from each other in the second direction DR2 with the first part 410 interposed therebetween. Each of the $(2\text{-}1)^{th}$ part 421 and the $(2\text{-}2)^{th}$ part 422 may be disposed adjacent of an edge of the support plate 300 extending in the first direction DR1.

A second area BB may be an area corresponding to the first area AA. When viewed on a plane, the second area BB may overlap the first area AA. The $(2\text{-}1)^{th}$ part 421 may overlap the first area AA.

According to the present disclosure, each of the $(2\text{-}1)^{th}$ part 421 and the $(2\text{-}2)^{th}$ part 422 may have the second modulus that is higher than the first modulus of the first part 410. Open areas at opposite ends of the plurality of openings OP in the second direction DR2 may be covered by the $(2\text{-}1)^{th}$ part 421 and the $(2\text{-}2)^{th}$ part 422 having the second modulus. The buckling phenomenon may be effectively prevented or removed due to the high rigidity of the $(2\text{-}1)^{th}$ part 421 and the $(2\text{-}2)^{th}$ part 422. Thus, the display device 1000 having improved reliability may be provided.

Further, unlike the present disclosure, the barrier layer may include an integral layer having the first modulus or the second modulus. When the barrier layer includes only a component having the relatively low first modulus, a thickness thereof may increase to satisfy a protection function, and the buckling phenomenon may occur in the first area AA. When the barrier layer includes only a component having the relatively high second modulus, the barrier layer may be peeled off due to an increase in a repulsive force and a bending rigidity of the barrier layer. However, according to the present disclosure, the barrier layer 400 may include the first part 410 and the second part 420 having different moduli. The first part 410 has the relatively low modulus to reduce a repulsive force between layers, and the second part 420 has the relatively high modulus to prevent or remove the buckling phenomenon occurring in the first area AA. Thus, the display device 1000 having improved reliability and increased lifetime may be provided.

Figure 8A:
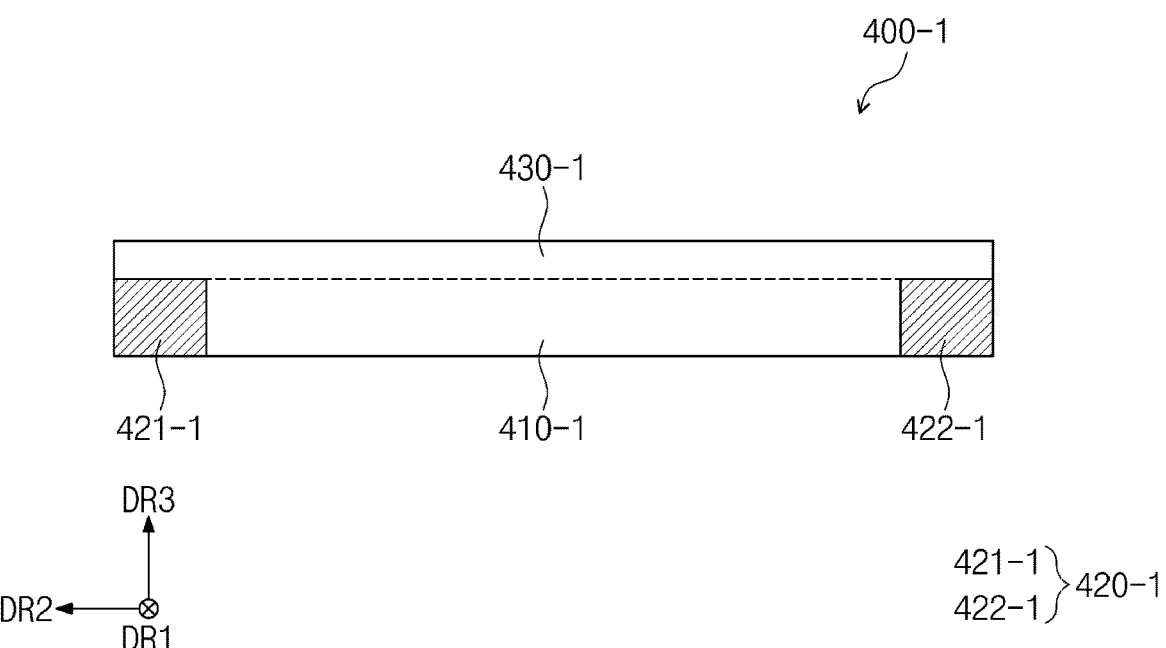
FIG. 8A is a cross-sectional view of the barrier layer according to another embodiment of the present disclosure.

FIG. 8A is a cross-sectional view of the barrier layer according to another embodiment of the present disclosure.

Referring to FIGS. 3 and 8A, a barrier layer 400-1 may be disposed between the display layer 100 and the support plate 300.

The barrier layer 400-1 may include a first part 410-1, a second part 420-1, and a third part 430-1.

The first part 410-1 may have the first modulus. The support plate 300 may be disposed under the first part 410-1.

The second part 420-1 may have the second modulus. The second modulus may be higher than the first modulus. The second part 420-1 may include a $(2\text{-}1)^{th}$ part 421-1 and a $(2\text{-}2)^{th}$ part 422-1. The support plate 300 may be disposed under the second part 420-1.

Each of the $(2\text{-}1)^{th}$ part 421-1 and the $(2\text{-}2)^{th}$ part 422-1 may extend in the first direction DR1. The $(2\text{-}1)^{th}$ part 421-1 and the $(2\text{-}2)^{th}$ part 422-1 may be spaced apart from each other in the second direction DR2 with the first part 410-1 interposed therebetween.

The third part 430-1 may have the first modulus. The third part 430-1 may be disposed on the first part 410-1 and the second part 420-1. When viewed on a plane, the third part 430-1 may cover the support plate 300. The display layer 100 may be disposed on the third part 430-1.

The third part 430-1 may be formed integrally with the first part 410-1. That is, the first part 410-1 and the third part 430-1 may be monolithic. However, this is exemplarily. The barrier layer 400-1 according to another embodiment of the present disclosure may further include an adhesive layer, the adhesive layer may be disposed between the first part 410-1 and the third part 430-1, and the first part 410-1 and the third part 430-1 may be coupled by the adhesive layer.

The barrier layer 400-1 may be formed by sequentially stacking the first part 410-1, the second part 420-1, and the third part 430-1. However, this is exemplarily, and the method of forming the barrier layer 400-1 according to an embodiment of the present disclosure is not limited thereto. For another example, the barrier layer 400-1 may be formed by forming a layer having the first modulus and covering the support plate 300, then etching a portion at which the second part 420-1 is to be formed, and filling a space formed through the etching with the material having the second modulus.

According to the present disclosure, each of the $(2\text{-}1)^{th}$ part 421-1 and the $(2\text{-}2)^{th}$ part 422-1 may be disposed adjacent of the edge of the support plate 300 extending in the first direction DR1. Each of the $(2\text{-}1)^{th}$ part 421-1 and the $(2\text{-}2)^{th}$ part 422-1 may have the second modulus higher than the first modulus of the first part 410-1 and the third part 430-1. Open areas at opposite ends of the plurality of openings OP in the second direction DR2 may be covered by the $(2\text{-}1)^{th}$ part 421-1 and the $(2\text{-}2)^{th}$ part 422-1 having the second modulus. The buckling phenomenon occurring in the first area AA may be effectively prevented or removed due to the high rigidity of the $(2\text{-}1)^{th}$ part 421-1 and the $(2\text{-}2)^{th}$ part 422-1. Thus, the display device 1000 having improved reliability may be provided.

Figure 8B:
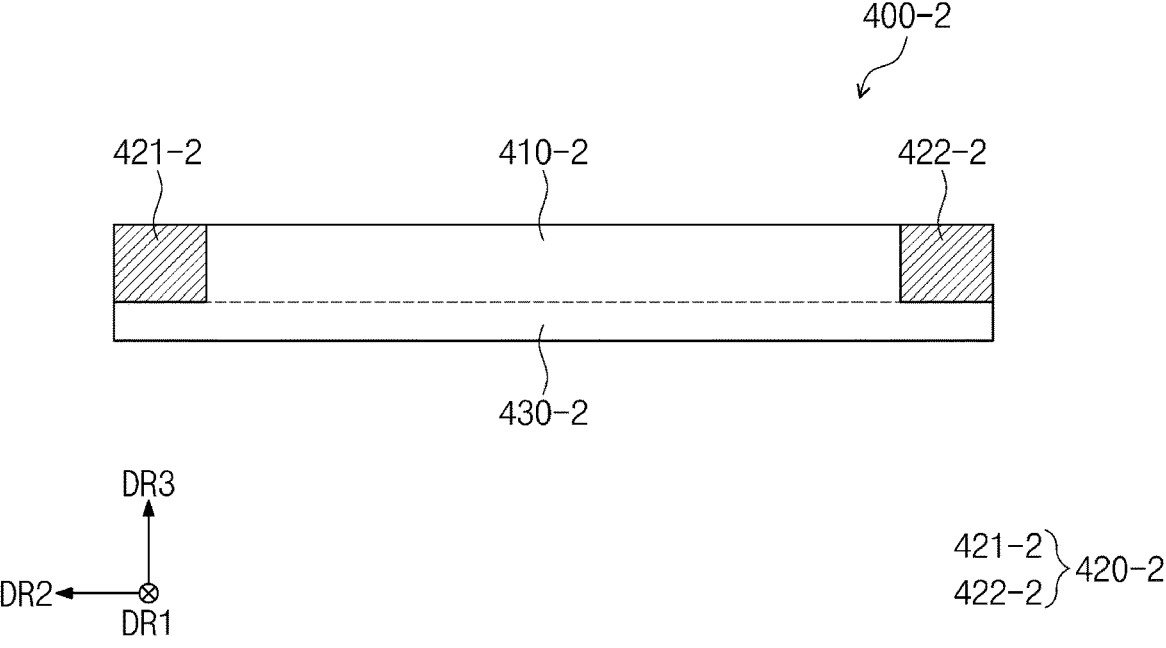
FIG. 8B is a cross-sectional view of the barrier layer according to still another embodiment of the present disclosure.

FIG. 8B is a cross-sectional view of the barrier layer according to still another embodiment of the present disclosure.

Referring to FIGS. 3 and 8B, a barrier layer 400-2 may be disposed between the display layer 100 and the support plate 300.

The barrier layer 400-2 may include a first part 410-2, a second part 420-2, and a third part 430-2.

The first part 410-2 may have the first modulus. The display layer 100 may be disposed on the first part 410-2.

The second part 420-2 may have the second modulus. The second modulus may be higher than the first modulus. The display layer 100 may be disposed on the second part 420-2. The second part 420-2 may include a $(2\text{-}1)^{th}$ part 421-2 and a $(2\text{-}2)^{th}$ part 422-2.

Each of the $(2\text{-}1)^{th}$ part 421-2 and the $(2\text{-}2)^{th}$ part 422-2 may extend in the first direction DR1. The $(2\text{-}1)^{th}$ part 421-2 and the $(2\text{-}2)^{th}$ part 422-2 may be spaced apart from each other in the second direction DR2 with the first part 410-2 interposed therebetween.

The third part 430-2 may have the first modulus. The third part 430-2 may be disposed under the first part 410-2 and the second part 420-2. When viewed on a plane, the third part 430-2 may cover the support plate 300. The support plate 300 may be disposed under the third part 430-2.

The third part 430-2 may be formed integrally with the first part 410-2. That is, the first part 410-2 and the third part 430-2 may be monolithic. However, this is exemplarily. The barrier layer 400-2 according to another embodiment of the present disclosure may further include an adhesive layer, the adhesive layer may be disposed between the first part 410-2 and the third part 430-2, and the first part 410-2 and the third part 430-2 may be coupled by the adhesive layer.

According to the present disclosure, the barrier layer 400-2 may include the first part 410-2, the second part 420-2, and the third part 430-2, which have at least two different moduli from each other. The first part 410-2 and the third part 430-2 have the relatively low modulus to reduce the repulsive force between layers, and the second part 420-2 has the relatively high modulus to prevent or remove the buckling phenomenon occurring in the first area AA. Thus, the display device 1000 having improved reliability and increased lifetime may be provided.

Figure 8C:
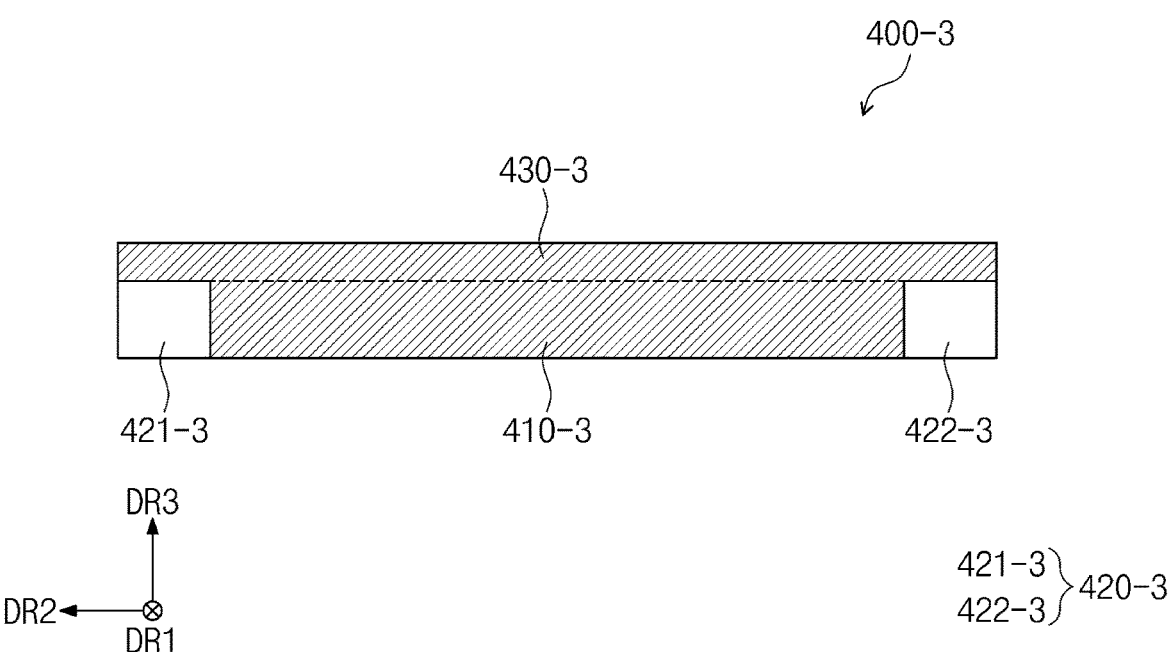
FIG. 8C is a cross-sectional view of the barrier layer according to yet another embodiment of the present disclosure.

FIG. 8C is a cross-sectional view of the barrier layer according to yet another embodiment of the present disclosure.

Referring to FIGS. 3 and 8C, a barrier layer 400-3 may be disposed between the display layer 100 and the support plate 300.

The barrier layer 400-3 may include a first part 410-3, a second part 420-3, and a third part 430-3.

The first part 410-3 may have the second modulus. The support plate 300 may be disposed under the first part 410-3.

The second part 420-3 may have the first modulus. The first modulus may be lower than the second modulus. The second part 420-3 may include a $(2\text{-}1)^{th}$ part 421-3 and a $(2\text{-}2)^{th}$ part 422-3. The support plate 300 may be disposed under the second part 420-3.

Each of the $(2\text{-}1)^{th}$ part 421-3 and the $(2\text{-}2)^{th}$ part 422-3 may extend in the first direction DR1. The $(2\text{-}1)^{th}$ part 421-3 and the $(2\text{-}2)^{th}$ part 422-3 may be spaced apart from each other in the second direction DR2 with the first part 410-3 interposed therebetween.

The third part 430-3 may have the second modulus. The third part 430-3 may be disposed on the first part 410-3 and the second part 420-3. When viewed on a plane, the third part 430-3 may cover the support plate 300. The display layer 100 may be disposed on the third part 430-3.

The third part 430-3 may be formed integrally with the first part 410-3. That is, the first part 410-3 and the third part 430-3 may be monolithic. However, this is exemplarily. The barrier layer 400-3 according to another embodiment of the present disclosure may further include an adhesive layer, the adhesive layer may be disposed between the first part 410-3 and the third part 430-3, and the first part 410-3 and the third part 430-3 may be coupled by the adhesive layer.

According to the present disclosure, the barrier layer 400-3 may include the first part 410-3, the second part 420-3, and the third part 430-3, which have at least two different moduli from each other. The first part 410-3 and the third part 430-3 have a relatively high modulus and thus may prevent or remove the buckling phenomenon occurring in the first area AA. The second part 420-2 has a relatively low modulus and thus may reduce the repulsive force between layers. Thus, the display device 1000 having improved reliability and increased lifetime may be provided.

Figure 8D:
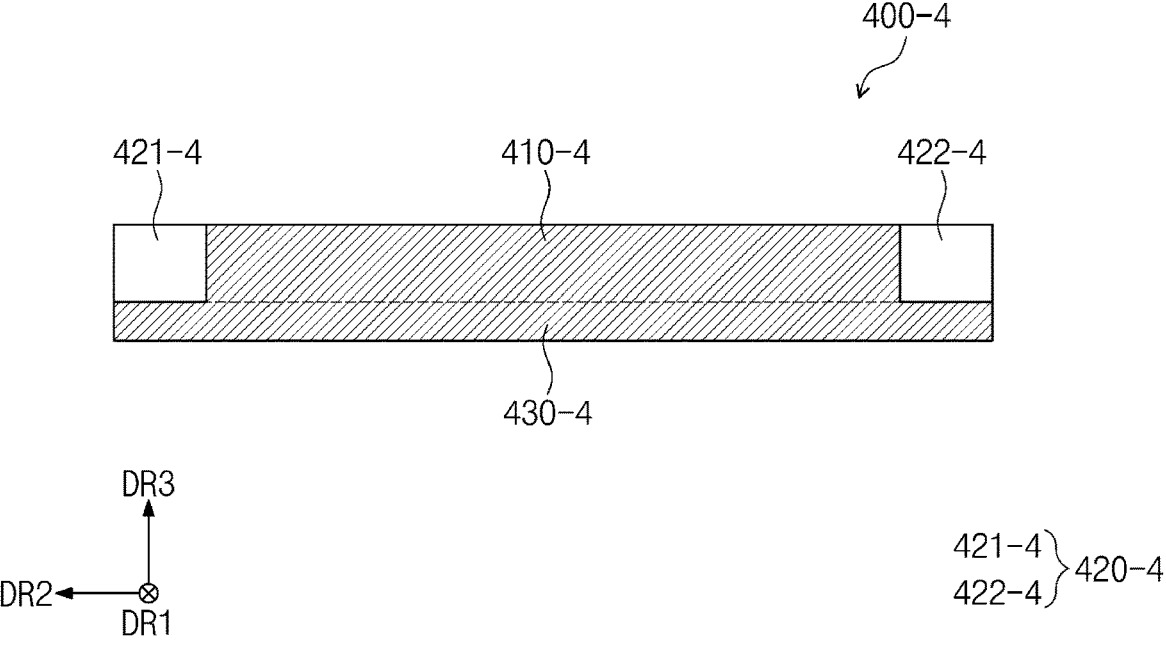
FIG. 8D is a cross-sectional view of the barrier layer according to another embodiment of the present disclosure.

FIG. 8D is a cross-sectional view of the barrier layer according to another embodiment of the present disclosure.

Referring to FIGS. 3 and 8D, a barrier layer 400-4 may be disposed between the display layer 100 and the support plate 300.

The barrier layer 400-4 may include a first part 410-4, a second part 420-4, and a third part 430-4.

The first part 410-4 may have the second modulus. The display layer 100 may be disposed on the first part 410-4.

The second part 420-4 may have the first modulus. The first modulus may be lower than the second modulus. The display layer 100 may be disposed on the second part 420-4. The second part 420-4 may include a $(2\text{-}1)^{th}$ part 421-4 and a $(2\text{-}2)^{th}$ part 422-4.

Each of the $(2\text{-}1)^{th}$ part 421-4 and the $(2\text{-}2)^{th}$ part 422-4 may extend in the first direction DR1. The $(2\text{-}1)^{th}$ part 421-4 and the $(2\text{-}2)^{th}$ part 422-4 may be spaced apart from each other in the second direction DR2 with the first part 410-4 interposed therebetween.

The third part 430-4 may have the second modulus. The third part 430-4 may be disposed under the first part 410-4 and the second part 420-4. When viewed on a plane, the third part 430-4 may cover the support plate 300. The support plate 300 may be disposed under the third part 430-4.

The third part 430-4 may be formed integrally with the first part 410-4. That is, the first part 410-3 and the third part 430-3 may be monolithic. However, this is exemplarily. The barrier layer 400-4 according to another embodiment of the present disclosure may further include an adhesive layer, the adhesive layer may be disposed between the first part 410-4 and the third part 430-4, and the first part 410-4 and the third part 430-4 may be coupled by the adhesive layer.

According to the present disclosure, the barrier layer 400-4 may include the first part 410-4, the second part 420-4, and the third part 430-4, which have at least two different moduli from each other. The first part 410-4 and the third part 430-4 have a relatively high modulus and thus may prevent or remove the buckling phenomenon occurring in the first area AA. The second part 420-4 has a relatively low modulus and thus may reduce the repulsive force between layers. Thus, the display device 1000 having improved reliability and increased lifetime may be provided.

Figure 9A:
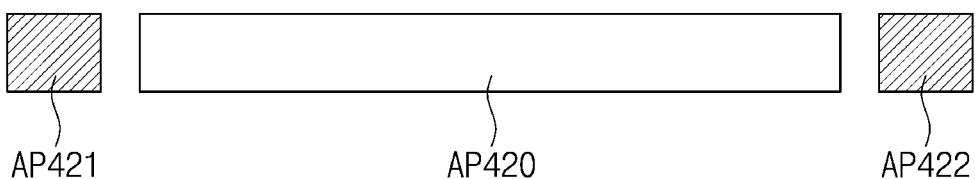
FIGS. 9A and 9B are cross-sectional views illustrating a method of manufacturing the barrier layer according to an embodiment of the present disclosure.
Figure 9B:
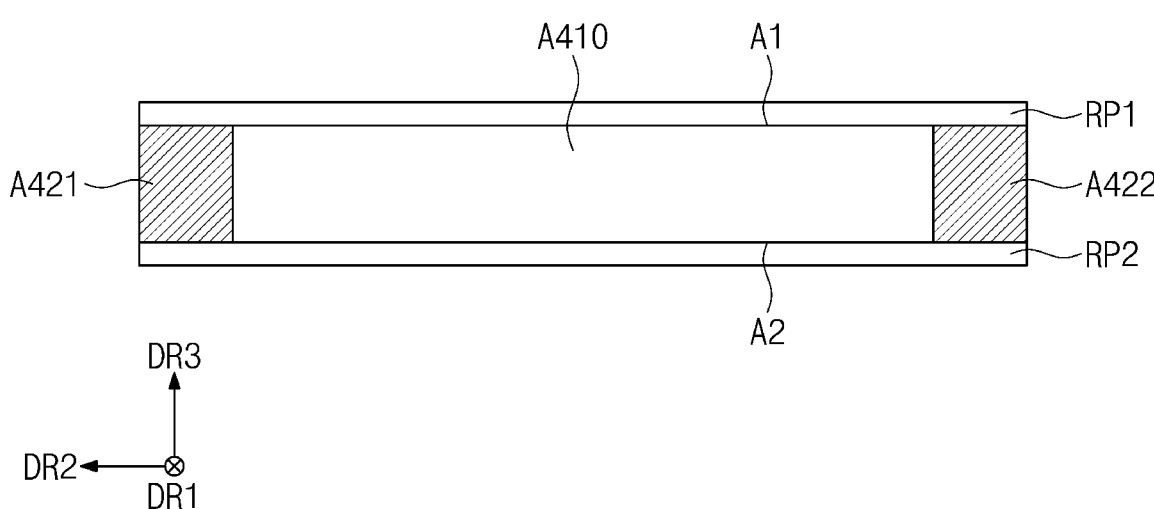

FIGS. 9A and 9B are cross-sectional views illustrating a method of manufacturing the barrier layer according to an embodiment of the present disclosure.

Referring to FIGS. 3, 9A, and 9B, a first preliminary part AP410 having the first modulus and a plurality of second preliminary parts AP421 and AP422 having the second modulus may be formed. The first modulus may be lower than the second modulus.

Thereafter, the first preliminary part AP410 and the plurality of second preliminary parts AP421 and AP422 may be coupled. A first part A410 and a plurality of second parts A421 and A422 that are coupled may be defined as the barrier layer 400.

A plurality of release papers RP1 and RP2 may be attached to a first surface A1 and a second surface A2, facing each other, of the first part A410 and the plurality of second parts A421 and A422 that are coupled.

Thereafter, the plurality of release papers RP1 and RP2 may be removed, the first surface A1 may be adhered to the first adhesive layer AD1, and the second surface A2 may be adhered to the second adhesive layer AD2. Accordingly, the display device 1000 may be manufactured.

Figure 10A:
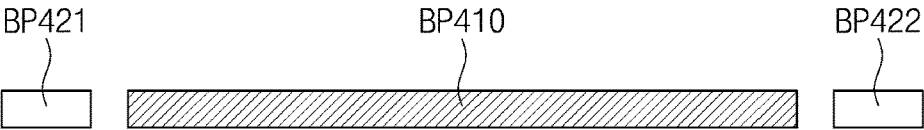
FIGS. 10A to 10C are cross-sectional views illustrating a method of manufacturing the barrier layer according to an embodiment of the present disclosure.
Figure 10B:
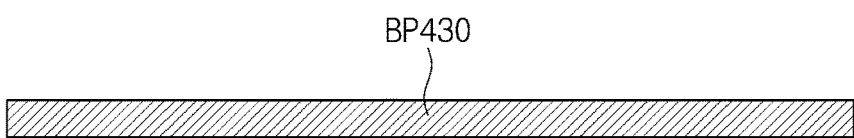
Figure 10C:
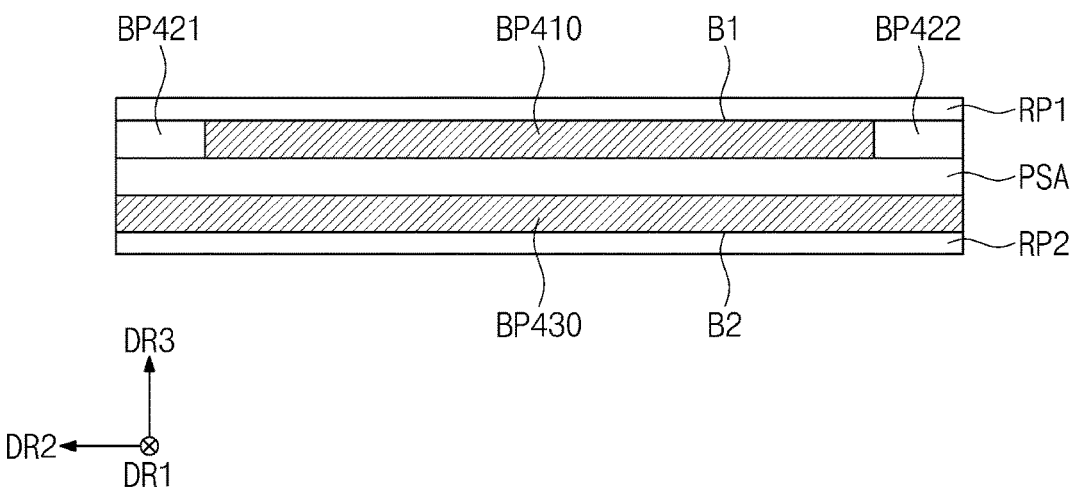

FIGS. 10A to 10C are cross-sectional views illustrating a method of manufacturing the barrier layer according to an embodiment of the present disclosure.

Referring to FIGS. 3 and 10A to 10C, a first preliminary part BP410 having the second modulus and a plurality of second preliminary parts BP421 and BP422 having the first modulus may be formed. The second modulus may be higher than the first modulus.

A third preliminary part BP430 having the second modulus may be formed.

Thereafter, the first preliminary part BP410 and the plurality of second preliminary parts BP421 and BP422 may be coupled to the third preliminary part BP430 by an adhesive layer PSA.

A first part B410, a plurality of second parts BP421 and BP422, the adhesive layer PSA, and a third part BP430 that are coupled may be defined as the barrier layer 400-4 (see FIG. 8D).

Thereafter, the plurality of release papers RP1 and RP2 may be attached to a first surface B1 of the first part B410 and the plurality of second parts BP421 and BP422 that are coupled and a second surface B2 of the third part BP430.

Thereafter, the plurality of release papers RP1 and RP2 may be removed, the first surface B1 may be adhered to the first adhesive layer AD1, and the second surface B2 may be adhered to the second adhesive layer AD2.

Figure 11A:
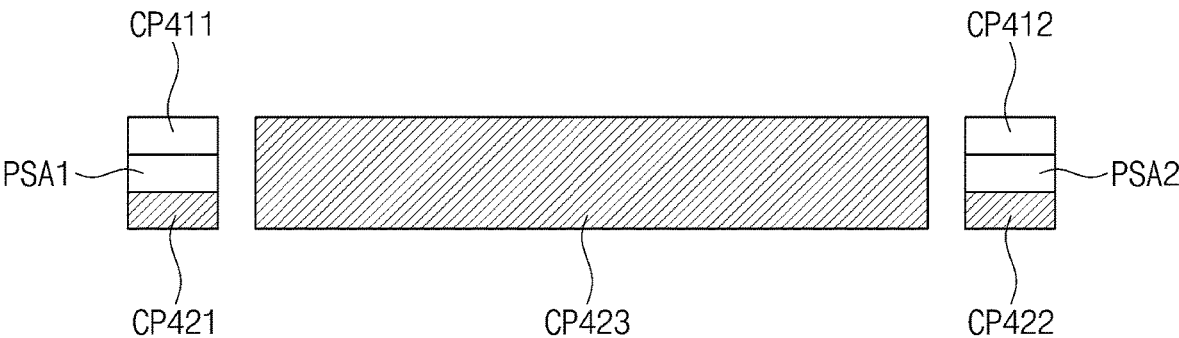
FIGS. 11A and 11B are cross-sectional views illustrating a method of manufacturing the barrier layer according to an embodiment of the present disclosure.
Figure 11B:
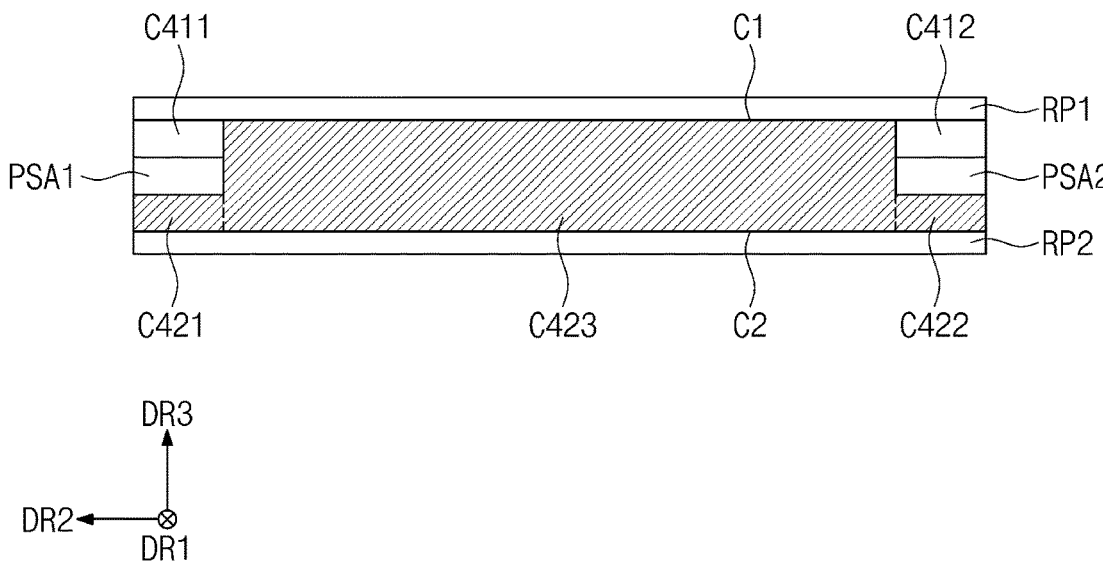

FIGS. 11A and 11B are cross-sectional views illustrating a method of manufacturing the barrier layer according to an embodiment of the present disclosure.

Referring to FIGS. 3, 11A, and 11B, a $(1\text{-}1)^{th}$ preliminary part CP411 and a $(2\text{-}1)^{th}$ preliminary part CP421 may be coupled to and stacked on each other by a first adhesive layer PSA1. The (1-1) preliminary part CP411, the first adhesive layer PSA1, and the $(2\text{-}1)^{th}$ preliminary part CP421 that are sequentially stacked may be referred to as a first layer.

A $(1\text{-}2)^{th}$ preliminary part CP412 and a $(2\text{-}2)^{th}$ preliminary part CP422 may be coupled to and stacked on each other by a second adhesive layer PSA2. The $(1\text{-}2)^{th}$ preliminary part CP412, the second adhesive layer PSA2, and the $(2\text{-}2)^{th}$ preliminary part CP422 that are sequentially stacked may be referred to as a second layer.

A $(2\text{-}3)^{th}$ preliminary part CP423 may be disposed between the first layer and the second layer. The $(2\text{-}3)^{th}$ preliminary part CP423 may have the same thickness as the thickness of each of the first layer and the second layer.

The $(1\text{-}1)^{th}$ preliminary part CP411 and the $(1\text{-}2)^{th}$ preliminary part CP412 may have the first modulus.

The $(2\text{-}1)^{th}$ preliminary part CP421, the $(2\text{-}2)^{th}$ preliminary part CP422, and the $(2\text{-}3)^{th}$ preliminary part CP423 may have the second modulus. The second modulus may be higher than the first modulus.

Thereafter, the first layer, the $(2\text{-}3)^{th}$ preliminary part CP423, and the second layer may be coupled to each other.

Thereafter, the plurality of release papers RP1 and RP2 may be attached to a first surface C1 and a second surface C2, facing each other, of a $(1\text{-}1)^{th}$ part C411, the first adhesive layer PSA1, a $(2\text{-}1)^{th}$ part C421, a $(1\text{-}2)^{th}$ part C412, the second adhesive layer PSA2, a $(2\text{-}2)^{th}$ part C422, and a $(2\text{-}3)^{th}$ part C423 that are coupled.

Thereafter, the plurality of release papers RP1 and RP2 may be removed, the first surface C1 may be adhered to the first adhesive layer AD1, and the second surface C2 may be adhered to the second adhesive layer AD2.

Figure 12A:
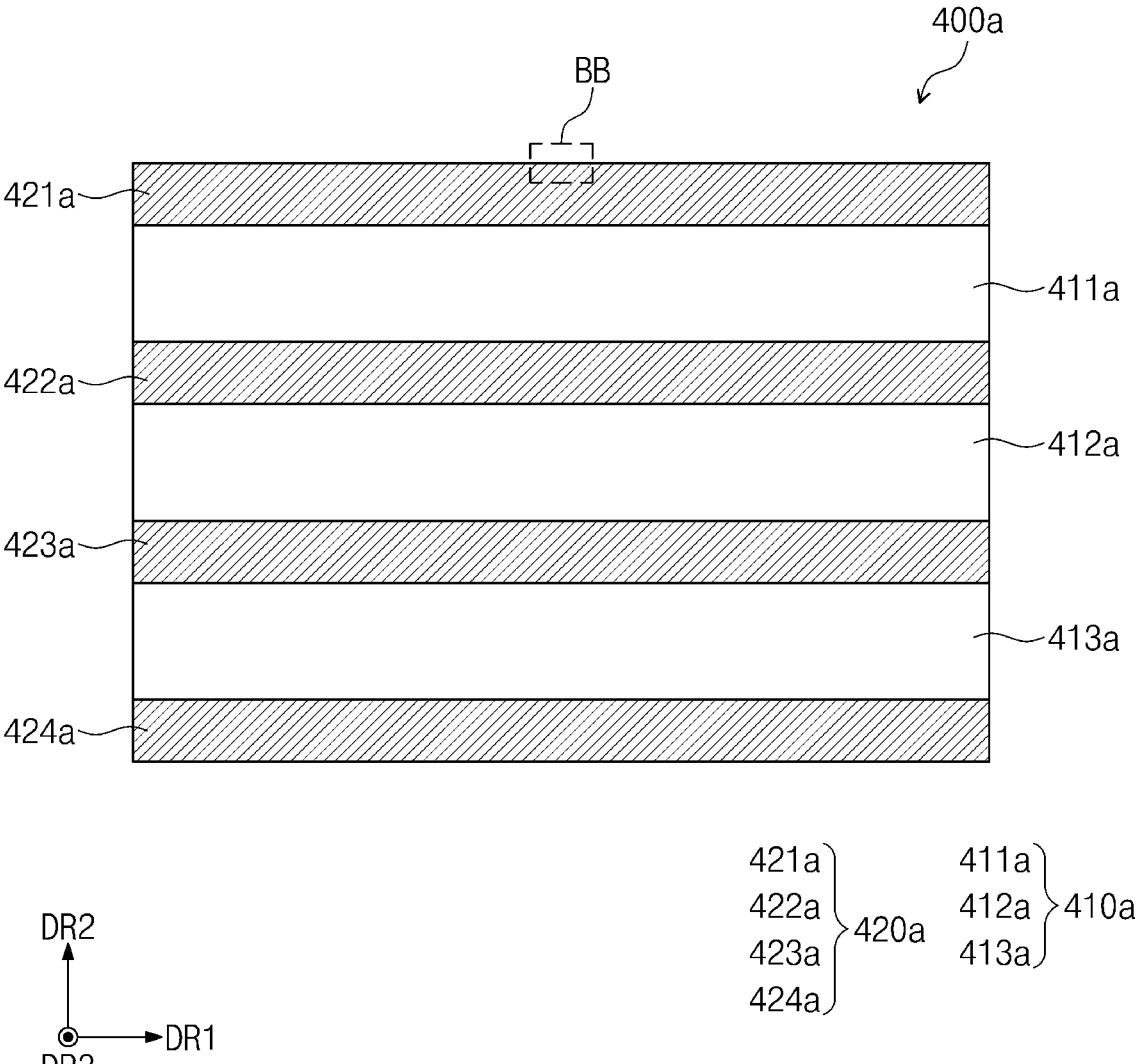
FIG. 12A is a plan view illustrating the barrier layer according to another embodiment of the present disclosure.

FIG. 12A is a plan view illustrating the barrier layer according to another embodiment of the present disclosure.

Referring to FIGS. 3, 5, and 12A, when viewed on a plane, a barrier layer 400a may cover the support plate 300. The barrier layer 400a may include a first part 410a and a second part 420a. The first part 410a and the second part 420a may be arranged in the same layer.

The first part 410a may have the first modulus. The first part 410a may include a $(1\text{-}1)^{th}$ part 411a, a $(1\text{-}2)^{th}$ part 412a, and a $(1\text{-}3)^{th}$ part 413a.

Each of the $(1\text{-}1)^{th}$ part 411a, the $(1\text{-}2)^{th}$ part 412a, and the $(1\text{-}3)^{th}$ part 413a may extend in the first direction DR1. The $(1\text{-}1)^{th}$ part 411a, the $(1\text{-}2)^{th}$ part 412a, and the $(1\text{-}3)^{th}$ part 413a may be spaced apart from each other in the second direction DR2.

The second part 420a may have the second modulus. The second modulus may be higher than the second modulus. The second part 420a may include a $(2\text{-}1)^{th}$ part 421a, a $(2\text{-}2)^{th}$ part 422a, a $(2\text{-}3)^{th}$ part 423a, and a $(2\text{-}4)^{th}$ part 424a.

Each of the $(2\text{-}1)^{th}$ part 421a, the $(2\text{-}2)^{th}$ part 422a, the $(2\text{-}3)^{th}$ part 423a, and the $(2\text{-}4)^{th}$ part 424a may extend in the second direction DR2. The $(2\text{-}1)^{th}$ part 421a, the $(2\text{-}2)^{th}$ part 422a, the $(2\text{-}3)^{th}$ part 423a, and the $(2\text{-}4)^{th}$ part 424a may be spaced apart from each other in the second direction DR2.

The $(2\text{-}1)^{th}$ part 421a, the $(1\text{-}1)^{th}$ part 411a, the $(2\text{-}2)^{th}$ part 422a, the $(1\text{-}2)^{th}$ part 412a, the $(2\text{-}3)^{th}$ part 423a, the $(1\text{-}3)^{th}$ part 413a, and the $(2\text{-}4)^{th}$ part 424a may be arranged alternately.

According to the present disclosure, the barrier layer 400a may include the first part 410a and the second part 420a, which have at least two different moduli from each other. The first part 410a has the relatively low modulus to reduce the repulsive force between layers, and the second part 420a has the relatively high modulus to prevent or remove the buckling phenomenon occurring in an area overlapping the second area BB in a plan view. Further, a plurality of second parts 420a may be provided to prevent damage to an interior of the display layer 100. Thus, the display device 1000 having improved reliability and increased lifetime may be provided.

Figure 12B:
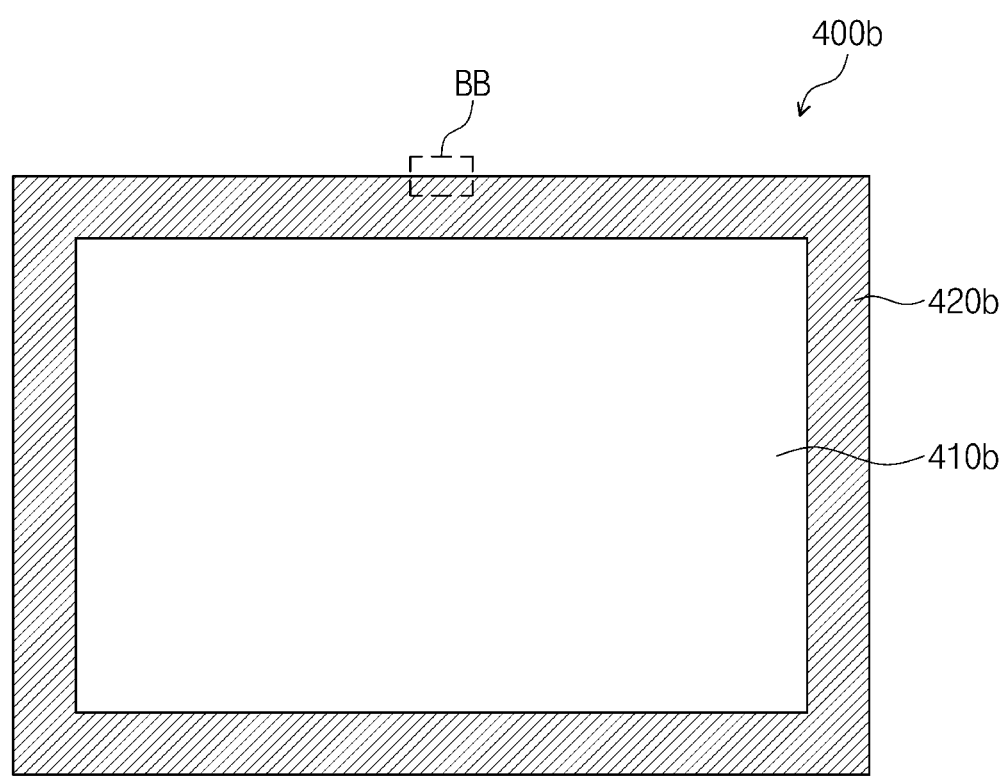
FIG. 12B is a plan view illustrating the barrier layer according to still another embodiment of the present disclosure.
Figure 12B:
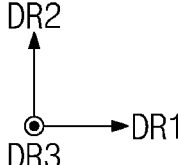

FIG. 12B is a plan view illustrating the barrier layer according to still another embodiment of the present disclosure.

Referring to FIGS. 3, 5, and 12B, when viewed on a plane, a barrier layer 400b may cover the support plate 300. The barrier layer 400b may include a first part 410b and a second part 420b. The first part 410b and the second part 420b may be arranged in the same layer.

The first part 410b may have the first modulus.

The second part 420b may have the second modulus. The second modulus may be higher than the first modulus. The second part 420b may be defined along the edge of the support plate 300. That is, the second part 420b may have a picture frame shape.

The first part 410b may be disposed inside the second part 420b.

According to the present disclosure, the barrier layer 400b may include the first part 410b and the second part 420b, which have at least two different moduli from each other. The first part 410b has the relatively low modulus to reduce the repulsive force between layers, and the second part 420b has the relatively high modulus to prevent or remove the buckling phenomenon occurring in an area overlapping the second area BB in a plan view. Further, the second part 420b may be formed along the edge of the support plate 300 to prevent damage to an edge of the display layer 100. Thus, the display device 1000 having improved reliability and increased lifetime may be provided.

Figure 12C:
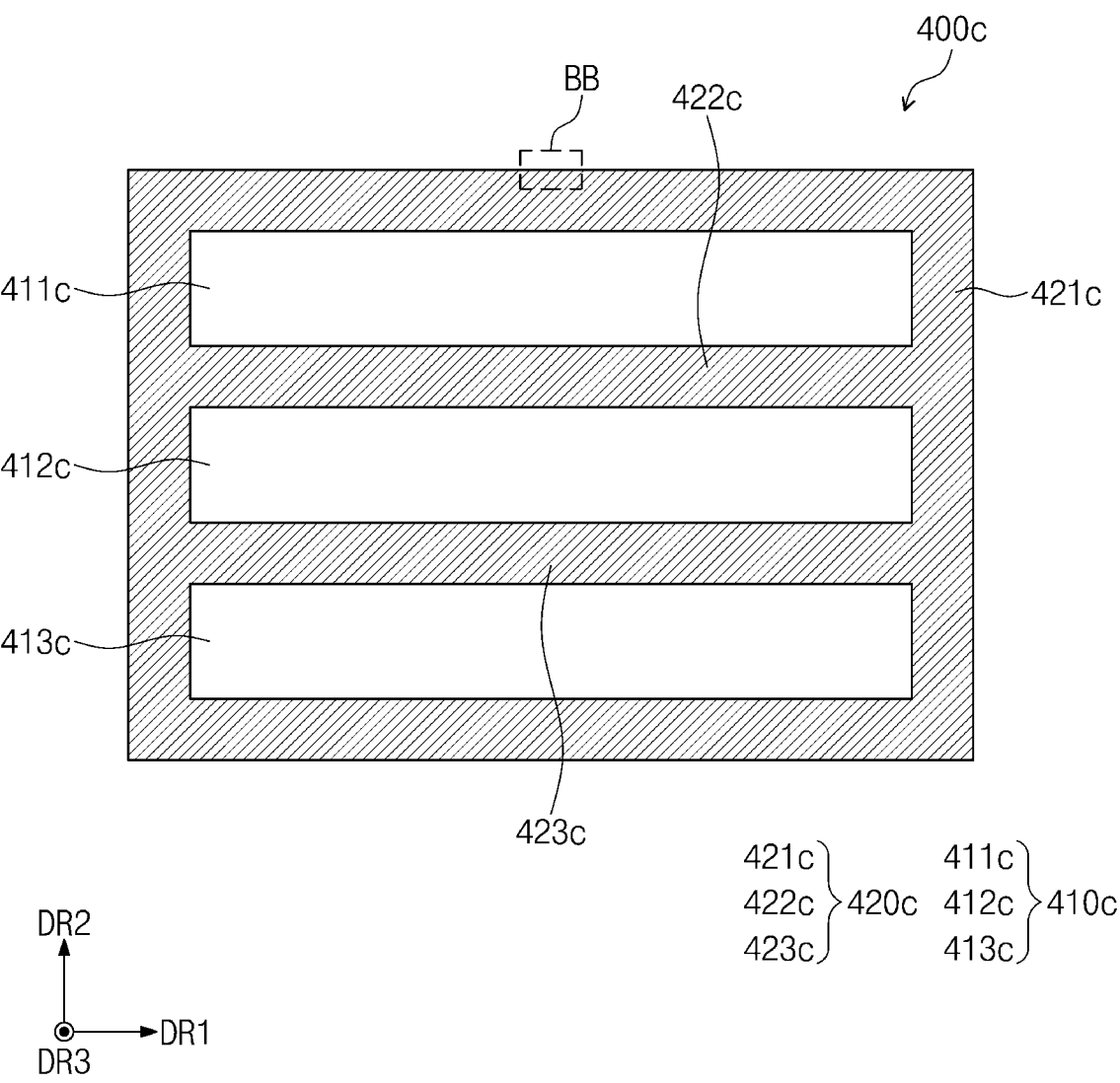
FIG. 12C is a plan view illustrating the barrier layer according to yet another embodiment of the present disclosure.

FIG. 12C is a plan view illustrating the barrier layer according to yet another embodiment of the present disclosure.

Referring to FIGS. 3, 5, and 12C, when viewed on a plane, a barrier layer 400c may cover the support plate 300. The barrier layer 400c may include a first part 410c and a second part 420c. The first part 410c and the second part 420c may be arranged in the same layer.

The first part 410c may have the first modulus. The first part 410c may include a $(1\text{-}1)^{th}$ part 411c, a $(1\text{-}2)^{th}$ part 412c, and a $(1\text{-}3)^{th}$ part 413c.

Each of the $(1\text{-}1)^{th}$ part 411c, the $(1\text{-}2)^{th}$ part 412c, and the $(1\text{-}3)^{th}$ part 413c may extend in the first direction DR1. The $(1\text{-}1)^{th}$ part 411c, the $(1\text{-}2)^{th}$ part 412c, and the $(1\text{-}3)^{th}$ part 413c may be spaced apart from each other in the second direction DR2.

The second part 420c may have the second modulus. The second modulus may be higher than the first modulus. The second part 420c may include a $(2\text{-}1)^{th}$ part 421c, a $(2\text{-}2)^{th}$ part 422c, and a $(2\text{-}3)^{th}$ part 423c.

The $(2\text{-}1)^{th}$ part 421c may be defined along the edge of the support plate 300.

Each of the $(2\text{-}2)^{th}$ part 422c and the $(2\text{-}2)^{th}$ part 423c may extend in the first direction DR1. The $(2\text{-}2)^{th}$ part 422c and the $(2\text{-}3)^{th}$ part 423c may be spaced apart from each other in the second direction DR2.

According to the present disclosure, the barrier layer 400c may include the first part 410c and the second part 420c, which have at least two different moduli from each other. The first part 410c has the relatively low modulus to reduce the repulsive force between layers, and the second part 420c has the relatively high modulus to prevent or remove the buckling phenomenon occurring in the area overlapping the second area BB in a plan view. Further, the second part 420c may be formed along the edge of the support plate 300 to prevent damage to the edge of the display layer 100. Further, a plurality of second parts 420c may be provided to prevent damage to an interior of the display layer 100. Thus, the display device 1000 having improved reliability and increased lifetime may be provided.

Figure 12D:
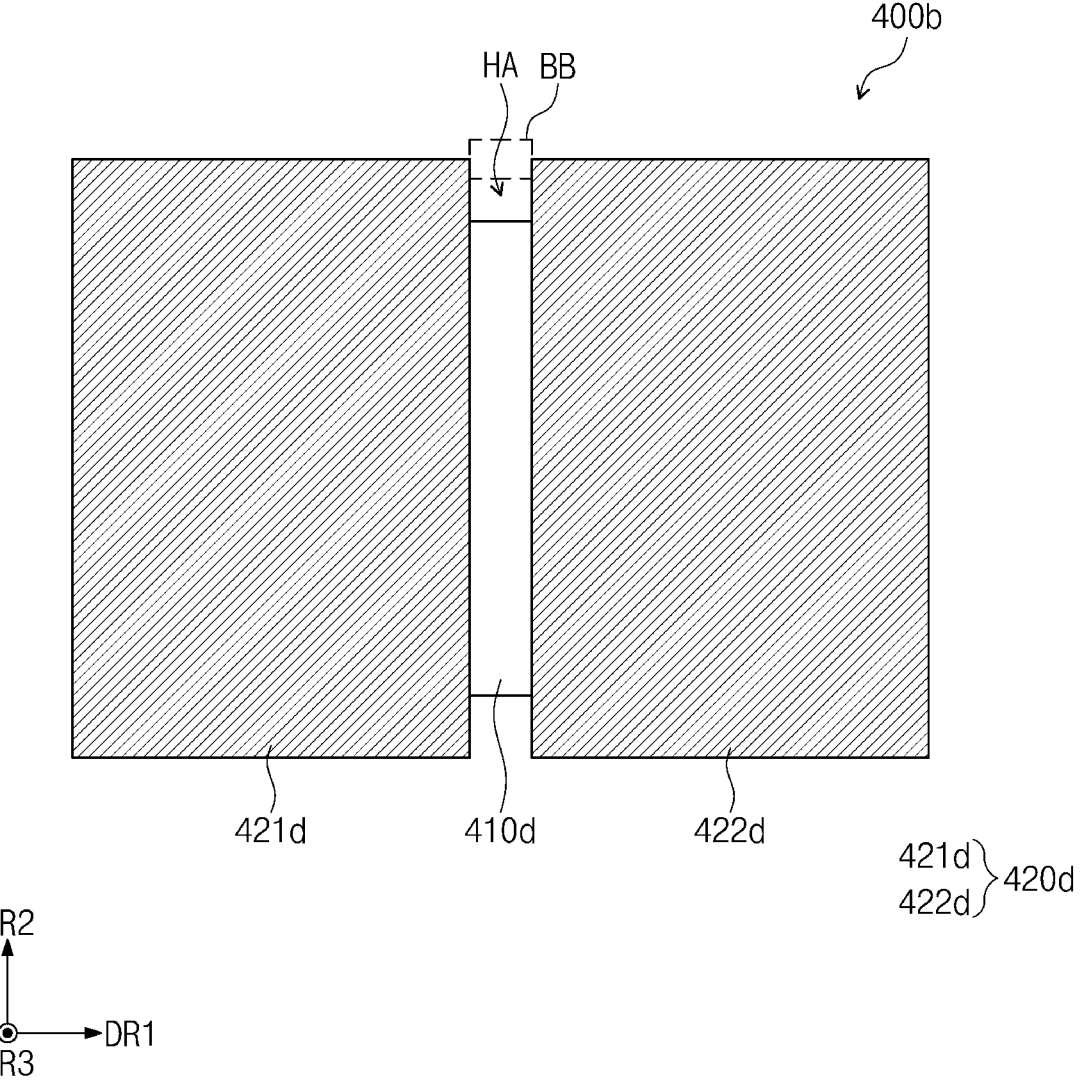
FIG. 12D is a plan view illustrating the barrier layer according to another embodiment of the present disclosure.

FIG. 12D is a plan view illustrating the barrier layer according to another embodiment of the present disclosure.

Referring to FIGS. 3, 5, and 12D, when viewed on a plane, a barrier layer 400d may cover the support plate 300. The barrier layer 400d may include a first part 410d and a second part 420d. The first part 410d and the second part 420d may be arranged in the same layer.

The first part 410d may include a third modulus. The first part 410d may overlap the folding area FD. The first part 410d may not overlap the edge of the support plate 300 in a plan view.

The second part 420d may include the second modulus. The second modulus may be higher than the third modulus. For example, the third modulus may have a rigidity that is higher than the first modulus and smaller than the second modulus, the first modulus and the second modulus being described above.

The second part 420d may include a $(2\text{-}1)^{th}$ part 421d and a $(2\text{-}2)^{th}$ part 422d. The $(2\text{-}1)^{th}$ part 421d and the $(2\text{-}2)^{th}$ part 422d may be spaced apart from each other in the first direction DR1 with the first part 410d interposed therebetween. The $(2\text{-}1)^{th}$ part 421d and the $(2\text{-}2)^{th}$ part 422d may each overlap the non-folding area NFD.

A width of the second part 420d in the second direction DR2 may be greater than a width of the first part 410d in the second direction DR2. A plurality of openings HA may be defined by the first part 410d and the second part 420d. When viewed on a plane, the plurality of openings HA may overlap the folding area FD.

According to the above description, a barrier layer may include a first part and a second part, which have at least two different moduli from each other. A first part has a relatively low modulus to reduce a repulsive force between layers, and the second part has a relatively high modulus to prevent or remove a buckling phenomenon occurring in open areas at opposite ends of a plurality of openings of a support plate. Thus, the display device having improved reliability and increased lifetime may be provided.

Although the description has been made above with reference to an embodiment of the present disclosure, it may be understood that those skilled in the art or those having ordinary knowledge in the art may variously modify and changes the present disclosure without departing from the spirit and technical scope of the present disclosure described in the appended claims. Accordingly, the technical scope of the present disclosure is not limited to the detailed description of the specification, but should be defined by the appended claims.

What is claimed is:

1. A display device comprising:
a display layer including a plurality of non-folding areas and a folding area disposed between the plurality of non-folding areas;
a barrier layer disposed under the display layer; and
a support plate disposed under the barrier layer,
wherein the barrier layer includes:
a first part having a first modulus; and
a second part adjacent to the first part and having a second modulus different from the first modulus,
wherein a plurality of openings are defined in an area of the support plate, which overlaps the folding area in a plan view, and
the second part overlaps at least some of the plurality of openings in the plan view.

2. The display device of claim 1, wherein the second modulus is greater than the first modulus.

3. The display device of claim 1, wherein the second part extends in a first direction, and
the first part extends in the first direction and is adjacent to the second part in a second direction intersecting the first direction.

4. The display device of claim 3, wherein the second part is provided in plurality, and
the plurality of second parts are spaced apart from each other in the second direction with the first part interposed therebetween.

5. The display device of claim 1, wherein the barrier layer further includes a third part disposed in a different layer from the first part and the second part, and
in a plan view, the third part covers the support plate.

6. The display device of claim 5, wherein the third part has the second modulus and is formed integrally with the second part,
the second part is provided in plurality, and
each of the plurality of second parts extends in a first direction, and the plurality of second parts are spaced apart from each other in a second direction intersecting the first direction with the first part interposed therebetween.

7. The display device of claim 5, wherein the third part has the first modulus and is formed integrally with the first part.

8. The display device of claim 5, wherein the barrier layer further includes an adhesive layer between the third part and the first part or between the first part and the second part.

9. The display device of claim 1, wherein the second part is provided in plurality,
each of the plurality of second parts extends in a first direction, and
the plurality of second parts are spaced apart from each other in a second direction intersecting the first direction.

10. The display device of claim 1, wherein, in a plan view, the second part is defined along an edge of the support plate, and in the plan view, the first part is surrounded by the second part.

11. The display device of claim 1, wherein the second part is provided in plurality, in a plan view, the plurality of second parts overlap the plurality of non-folding areas, and in the plan view, the first part does not overlap an edge of the support plate.

12. A display device comprising:

a display layer including a plurality of non-folding areas and a folding area disposed between the plurality of non-folding areas;

a barrier layer disposed under the display layer; and a support plate disposed under the barrier layer, wherein the barrier layer includes:

a first part extending in a first direction in a plan view and having a first modulus; and a second part adjacent to the first part in a second direction intersecting the first direction in the plan view and having a second modulus higher than the first modulus, wherein, in the plan view, the first part overlaps portions of the folding area and the plurality of non-folding areas.

13. The display device of claim 12, wherein, a plurality of openings are defined in an area of the support plate, which overlaps the folding area in the plan view, and the first part overlaps at least some of the plurality of openings in the plan view.

14. The display device of claim 12, wherein the second part is provided in plurality, and the plurality of second parts are spaced apart from each other in the second direction with the first part interposed therebetween.

15. The display device of claim 12, wherein, in the plan view, the barrier layer covers the support plate.

16. The display device of claim 12, wherein the first part and the second part are arranged in a same layer.

17. The display device of claim 12, wherein a display area and a non-display area adjacent to the display area are defined on the display layer, and the display layer is out-folded so that the display area is exposed to an outside.

18. A display device comprising:

a display layer including a plurality of non-folding areas and a folding area disposed between the plurality of non-folding areas;

a barrier layer disposed under the display layer;

a support plate disposed under the barrier layer;

a first adhesive layer disposed between the display layer and the barrier layer; and a second adhesive layer disposed between the barrier layer and the support plate wherein the barrier layer includes:

a first part extending in a first direction in a plan view and having a first modulus; and a second part adjacent to the first part in a second direction intersecting the first direction in the plan view and having a second modulus higher than the first modulus.

* * * * *